United States Patent [19]
Bohac, Jr.

[11] Patent Number: 6,166,984
[45] Date of Patent: Dec. 26, 2000

[54] NON-VOLATILE COUNTER

[75] Inventor: Frank John Bohac, Jr., Tustin, Calif.

[73] Assignee: Custom Silicon Solutions, Inc., Huntington Beach, Calif.

[21] Appl. No.: 09/360,404

[22] Filed: Jul. 23, 1999

[51] Int. Cl.⁷ .................................................. G11C 13/00
[52] U.S. Cl. ........................................... 365/229; 365/226
[58] Field of Search .................................. 365/51, 185.18, 365/185.26, 185.27

[56] References Cited

U.S. PATENT DOCUMENTS 5,656,840   8/1997   Yang ..................................... 365/185.27

*Primary Examiner*—Terrell W. Fears
*Attorney, Agent, or Firm*—Blakely Sokoloff Taylor & Zafman LLP

[57] ABSTRACT

In one embodiment, the present invention relates to a particular configuration of a non-volatile counter, which significantly reduces the amount of area required for implementation in an integrated circuit and improves its reliability of operation. This is accomplished by (1) replacing the volatile binary counter with a volatile counter coded for more equal distribution the changes in logic state over the entire counter, (2) replacing the non-volatile latch circuit with a single non-volatile memory element, and (3) developing testing techniques for complete and efficient testing of the critical non-volatile memory elements.

22 Claims, 11 Drawing Sheets

NON-VOLATILE COUNTER

BACKGROUND

1. Field

This invention relates to non-volatile electronic counters in integrated circuits, more specifically, a counter which can store volatile digital data in a non-volatile register prior to power outage and can recall the data following the power outage.

2. General Background

Non-volatile counters implemented in integrated circuits typically consist of a volatile counter that has the capability of transferring its contents to a non-volatile register prior to power being removed. When power is restored, the contents of the non-volatile register (retained during the power off condition) are transferred back into the volatile counter and counting can continue where it ended prior to the disruption of power. This integrated circuit configuration is typically implemented with (i) binary volatile counter well known in the industry and (ii) one or more non-volatile registers (referred to as a "latch circuit") as set forth in U.S. Pat. No. 4,571,704.

This latch circuit configuration is complex to design and occupies a large amount of area when implemented in an integrated circuit. For example, the latch circuit requires two non-volatile transistors to store its logic state during the power off condition, one for each side of the latch circuit. Often, since the non-volatile memory elements have a limited lifetime, two non-volatile transistors are used for each side of the latch circuit to provide more reliable operation through redundancy. Since the non-volatile transistors used in the latch circuit are all relatively large, the use of four non-volatile transistors to store one bit of data is an inefficient use of area in the integrated circuit and results in a high implementation cost.

There are also reliability concerns for this implementation. Under conventional memory designs, non-volatile transistors placed in a parallel redundant manner are tested in a collective manner by monitoring a voltage level at a shared node. These transistors cannot be tested independently after manufacture. One difficulty is that that non-volatile transistors typically reside in an "open" or non-conducting state upon failure. Therefore, if one of the transistors has failed and no redundancy is present, the testing may still reveal that the latch circuit is operating properly. This has an effect on long term reliability of the non-volatile counters.

Also, a general reliability problem in non-volatile counters is that the volatile counter is typically coded in binary, where the least significant bits change state substantially more often than the most significant bits in the counter. Therefore, when information in the counter is transferred into the non-volatile latches, the latches receiving the least significant bits change state more often than those receiving the more significant bits. As a result, the latches responsible for storing the least significant bit of the volatile counter will normally fail well before latches associated with the other bits. In many situations, the volatile counter is implemented in a binary coded decimal configuration (a decimal configuration, with each decimal coded in binary and often referred to as a "BCD" configuration) rather than a straight binary counter. The reliability problem is the same for this configuration, as the least significant bits of each decimal stage change state in a binary fashion and the lower order decimal stages change state more often than the higher order stages.

SUMMARY

In one embodiment, the present invention relates to a particular configuration of a non-volatile counter, which significantly reduces the amount of area required for implementation in an integrated circuit and improves its reliability of operation. This is accomplished by (1) replacing the volatile binary counter with a volatile counter coded for more equal distribution the changes in logic state over the entire counter, (2) replacing the non-volatile latch circuit with a single non-volatile memory element, and (3) developing testing techniques for complete and efficient testing of the critical non-volatile memory elements.

This configuration for the volatile counter significantly improves the reliability by reducing the maximum number of times bits of the non-volatile memory element are likely to change during the lifetime of the volatile counter. By more equally distributing the count over all the bits of the register, the typical characteristic for failure of the least significant bits is eliminated. The decimal counting configuration is ideal for using this new counting algorithm since it requires the same number of flip-flops as a (BCD) counter, yet reduces the maximum number of state changes by a factor of approximately 2.5.

The non-volatile memory element in this invention is a single element, such as a single non-volatile memory transistor. This transistor is programmed to reside in either an ON or OFF state, depending on the state the volatile counter at power-down. At power-on, a bias current is applied to the non-volatile transistor to determine its state, either ON or OFF. This increased simplicity, compared to the prior art, which consisted of two non-volatile transistors configured in a latching circuit, would result in reduced silicon area which makes the integrated circuit in which it is fabricated smaller and less expensive. In addition, it is simple in this case to add parallel redundancy to improve the reliability of the non-volatile transistor. Since there is only one non-volatile transistor, only one redundant transistor would be needed. Also, since the non-volatile transistors are not in a latching configuration, it is easy to test them individually after manufacture to assure both are working. This assures the redundancy, and hence the required reliability is achieved.

BRIEF DESCRIPTION OF THE DRAWINGS

The features and advantages of the present invention will become apparent from the following detailed description of the present invention in which.

DETAILED DESCRIPTION

Herein, embodiments of an improved non-volatile counter are illustrated in FIGS. 1–11. The non-volatile counter is designed to significantly reduce the amount of area needed for implementation in an integrated circuit and to improve reliability. This is accomplished by implementing (i) a counter that more equally distributes changes in logic state over the entire counter in lieu a volatile binary counter and (ii) a single non-volatile memory element in lieu of a non-volatile latch circuit. Also, the improved non-volatile counter provides for complete and efficient testing of the critical non-volatile memory elements.

In the following description, certain terminology is used to describe characteristics of the present invention as well as its functionality. For example, a "counter" includes logic that adjusts a count value by incrementing or decrementing the count value. The term "high" indicates that a signal is at a predetermined voltage (e.g., 4–5 volts). The term "low" indicates that a signal is at a voltage ranging from zero to one volt. Of course, these voltage levels may be adjusted for higher and/or lower power supply voltages. A signal is chosen to be "active low" when the last letter of the signal name ends with the letter "B".

Figure 1:
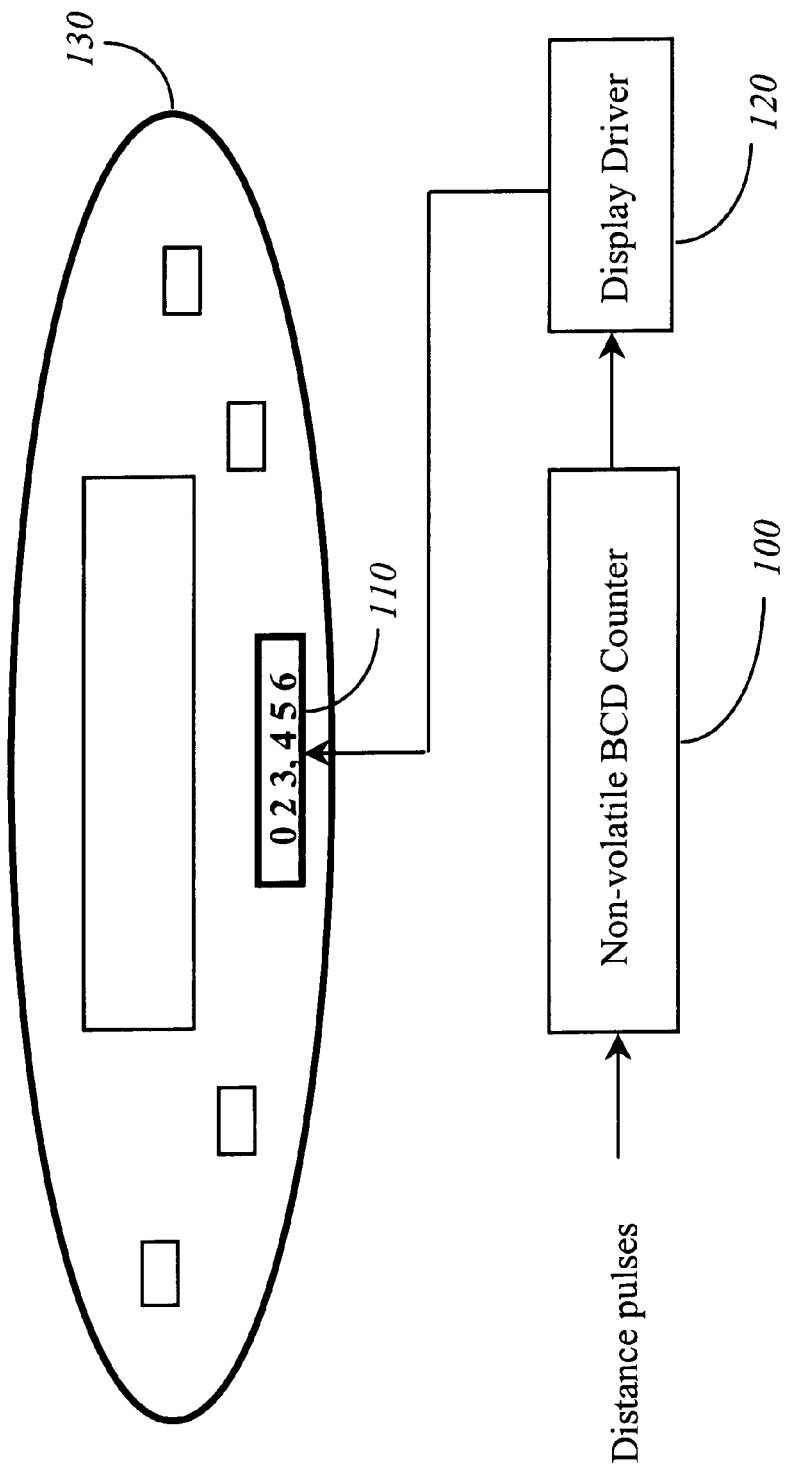
FIG. 1 is an illustrative embodiment of a non-volatile counter employed in an odometer system.

Referring to FIG. 1, an illustrative embodiment of a non-volatile binary coded decimal (BCD) counter 100 is shown. Herein, counter 100 is used as an odometer system of a vehicle. Distance pulses from a vehicle sensor are counted by non-volatile BCD counter 100 and the result is displayed in an odometer display 110 via a display driver 120 of a vehicle control panel 130. Non-volatile BCD counter 100 stores the counted miles in non-volatile memory when the vehicle power is removed and restores that mileage when the power is restored.

Figure 2:
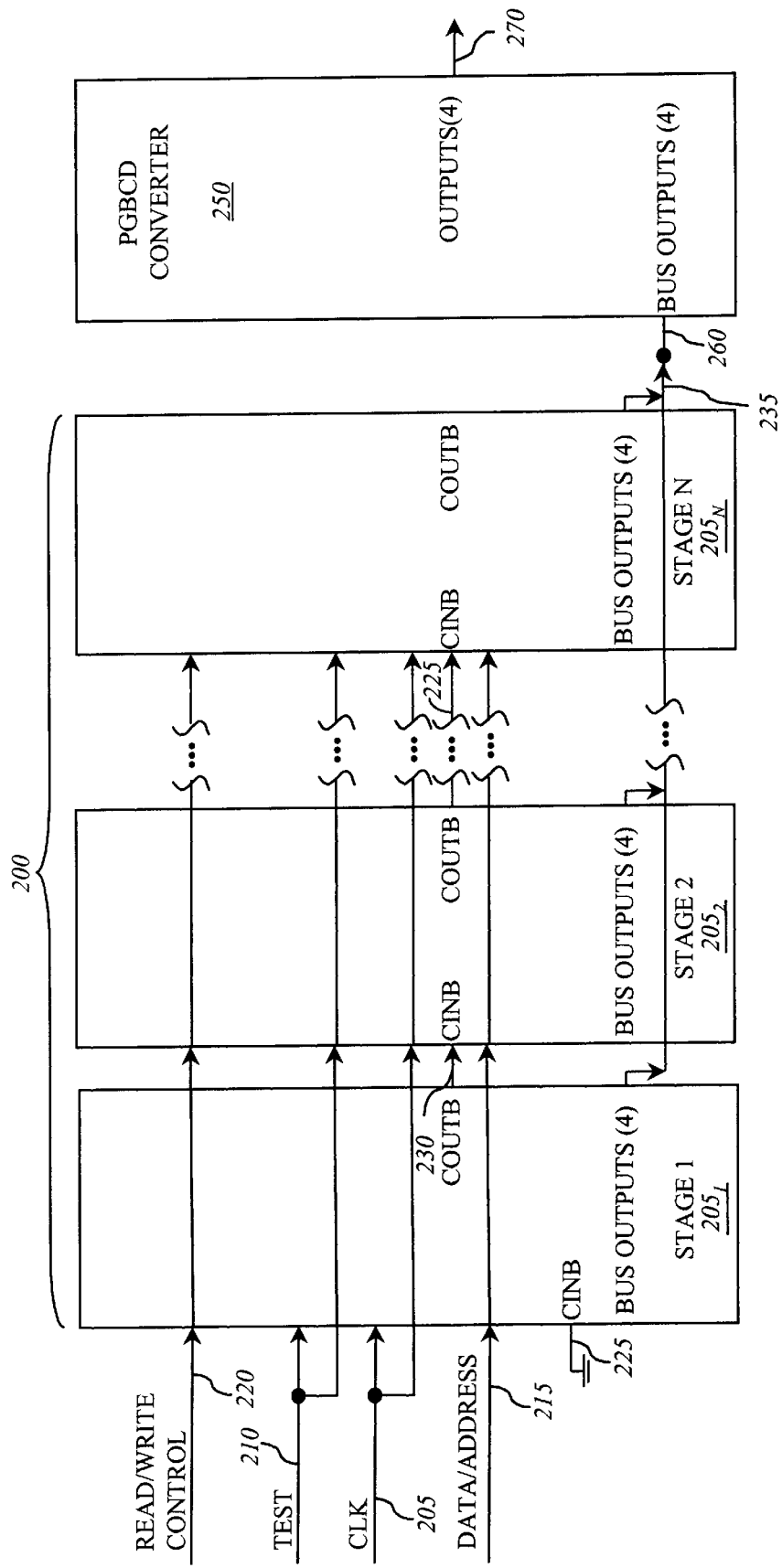
FIG. 2 is an illustrative block diagram of an N-stage non-volatile binary coded decimal (BCD) counter including a pseudo gray-to-BCD (PGBCD) converter.

Referring now to FIG. 2, an embodiment of non-volatile BCD counter 100 of FIG. 1 is shown. Herein, in this embodiment, non-volatile BCD counter 100 comprises an N-stage pseudo gray counter 200 and a pseudo gray-to-binary coded decimal (PGBCD) converter 250. Each stage 205₁–205ₙ of pseudo gray counter 200 is coupled in parallel to a clock signal line 205 and a test signal line 210. Clock signal line 205 provides a standard clock signal (CLK) for synchronization of N-stages of pseudo gray counter 200 without prior loading on carry signals. Test signal line 210 places BCD counter 100 into a test mode when test signal line 210 is active.

DATA/ADDRESS line 215 receives data or address as input to select the $N^{th}$ stage of pseudo gray counter 200. READ/WRITE control line 220 controls the operations of pseudo gray counter 200. Most carry signal inputs (CINB) and carry signal outputs (COUTB) 230 are provided to successive stages of pseudo-gray counter 200. Of course, CINB 225 of a first stage 205₁ is tied low and remains active while CINB signals for the remaining N–$1^{th}$ stages are provided from COUTB signals of a proceeding stage.

As shown, DATA/ADDRESS line 215 selects from which stage 205₁–205ₙ binary output bits are placed on output bus 235. Herein, output bus 235 is represented by four (4) bit lines for configuration as a binary decimal counter, although the invention may be employed with different-sized counters. The output bits placed on output bus 235 are in accordance with a coding is similar to a well-known Gray coding (referred to a "pseudo-gray" code) and not standard binary coding. This pseudo-gray code is illustrated as follows:

| Decimal Count | Binary Code | Pseudo-Gray Code |
| --- | --- | --- |
| 0 | 0000 | 0000 |
| 1 | 0001 | 0001 |
| 2 | 0010 | 0011 |
| 3 | 0011 | 0110 |
| 4 | 0100 | 0100 |
| 5 | 0101 | 1000 |
| 6 | 0110 | 1001 |
| 7 | 0111 | 1011 |
| 8 | 1000 | 1110 |
| 9 | 1001 | 1100 |

For each stage of pseudo gray counter 200, it is contemplated that its least significant bit changes state four (4) times in a ten (10) count as compared to ten (10) times for a standard binary counter. Thus, pseudo gray counter 200 reduces the maximum number of times any particular bit changes. This will improve the reliability of the non-volatile register in which the bits are stored since typical non-volatile counters are limited in the maximum number of times they may change state.

As still shown in FIG. 2, pseudo gray-to-BCD (PGBCD) converter 250 converts this pseudo-gray code routed to bus input port 260 to standard binary coding produced at output 270. In this case, there is no provision for driving a display and the outputs would probably be read by a computer or processor.

Figure 3:
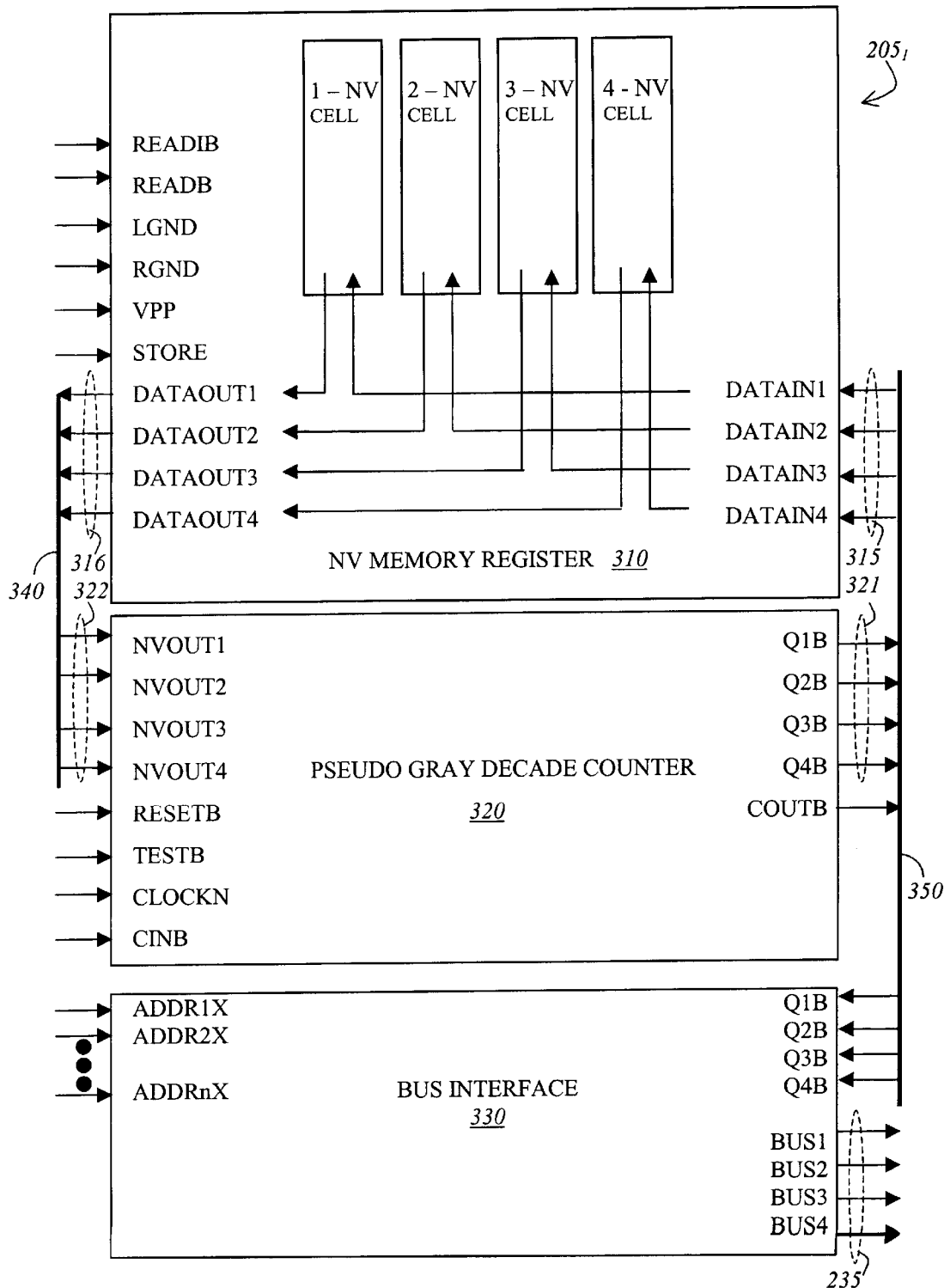
FIG. 3 is an illustrative block diagram of an embodiment of a single stage of the non-volatile BCD counter of FIG. 2.

FIG. 3 illustrates an embodiment of a single stage (e.g., first stage 205₁) of pseudo-gray counter 200 of FIG. 2. Stage 205₁ comprises a non-volatile (NV) memory register 310, a pseudo gray decade counter 320 and a bus interface 330. NV memory register 310 further comprises non-volatile memory cells (NV CELL) 311–314. The contents of non-volatile counter 100 of FIG. 1 are transferred in parallel between non-volatile memory register 310 and pseudo-gray decade counter 320 over a first bus 340 at power-up and over a second bus 350 at power-down.

For example, information is transferred to non-volatile memory register 310 via Q×B ports 321 and DATAINx ports 315 at power-down (where "x" ranges up to the number of bits supported by NV cells 311–314). The information is returned to pseudo-gray decade counter 320 at power-up via DATAOUTx and NVOUTx ports 316 and 322, respectively. If each stage 205₁–205ₙ of FIG. 2 is used in this manner, non-volatile counter 100 of FIG. 1 will retain its count during power-down, and will start with that count when power is returned. In this embodiment, bus interface 330 is used to transfer incoming information (e.g., pseudo-gray code) to output bus 235 during a normal read operation.

Figure 4:
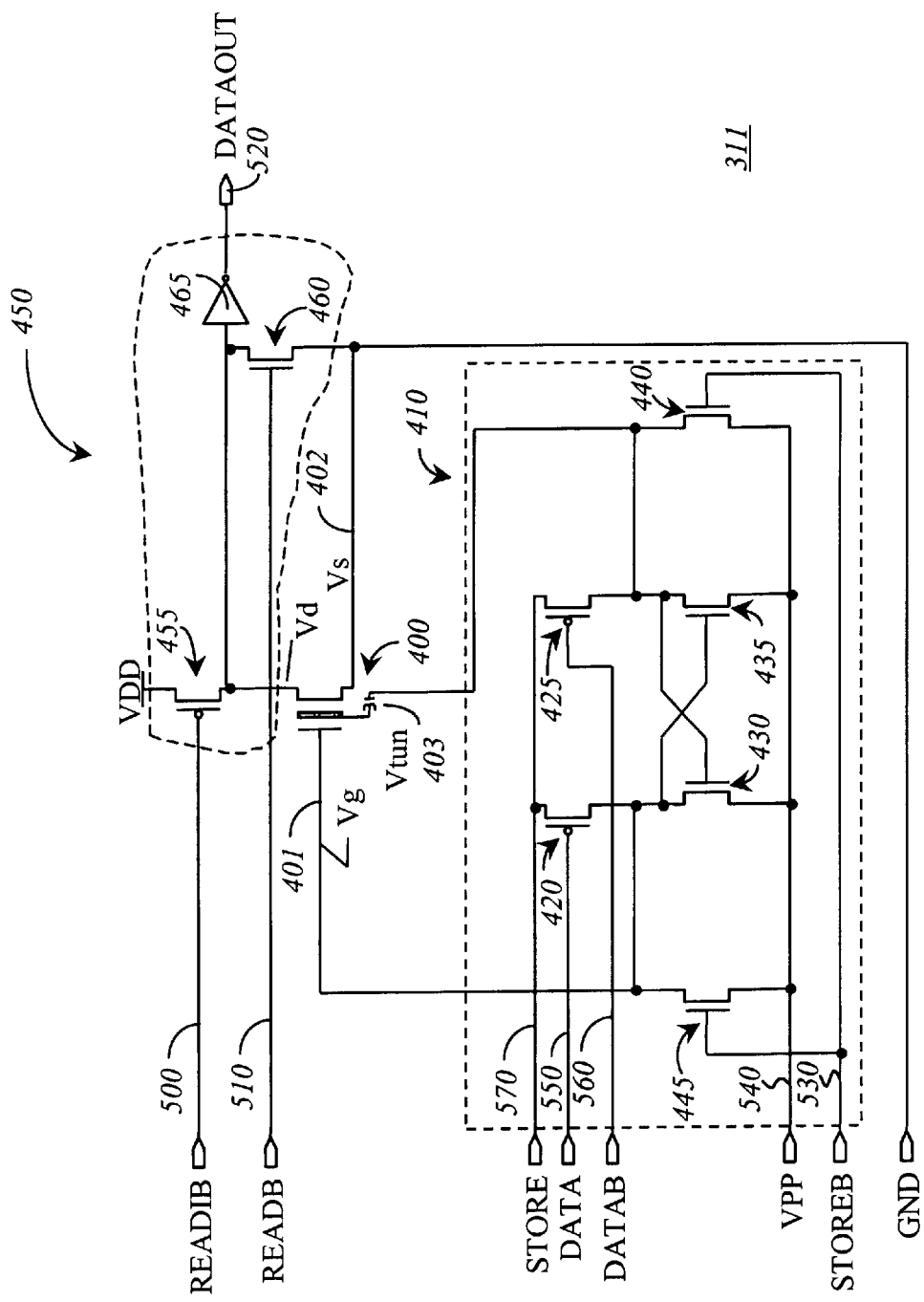
FIG. 4 is an illustrative block diagram of an embodiment of a non-volatile memory cell and programming and reading circuitry employed in the single stage of FIG. 3.
Figure 5:
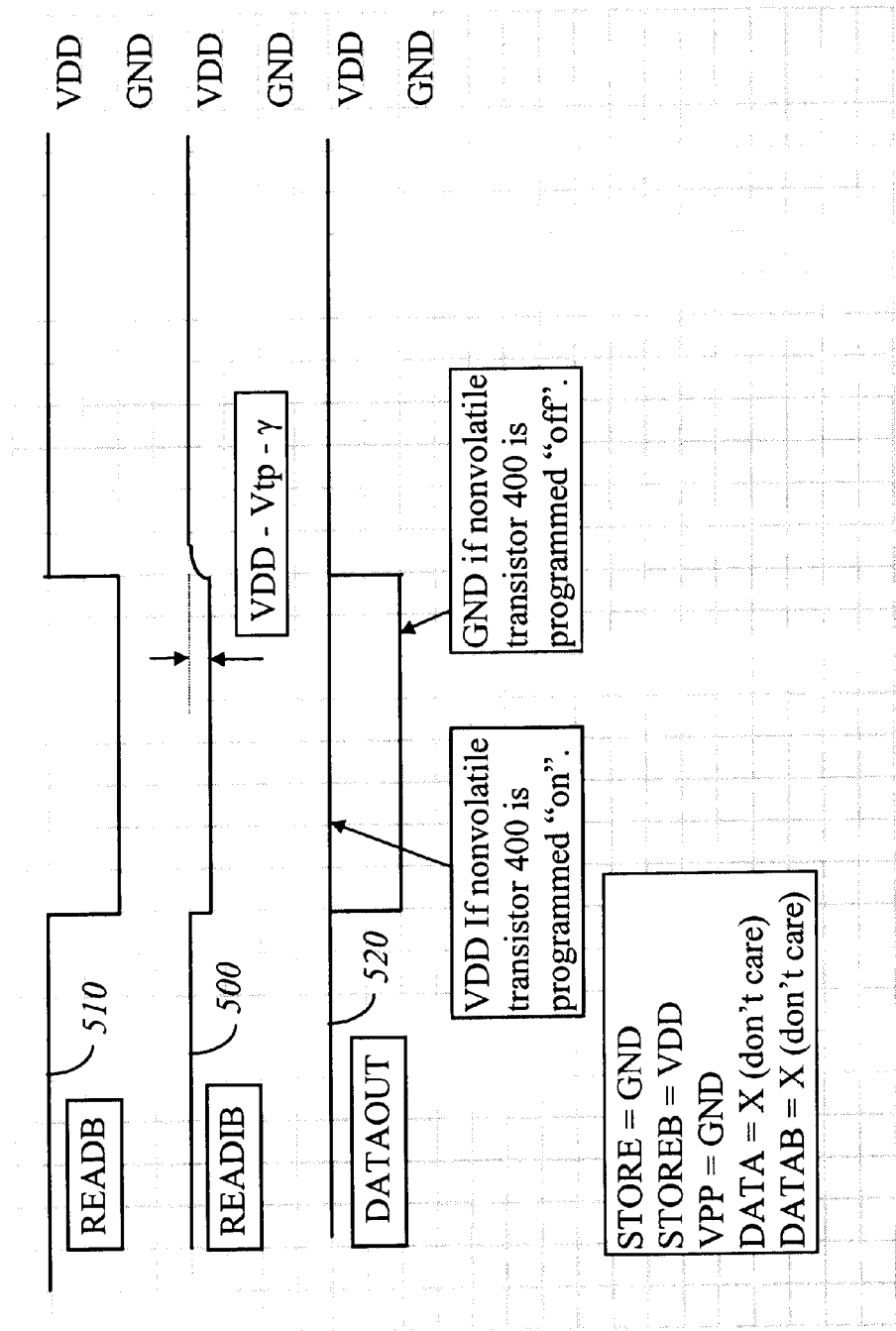
FIG. 5 is an illustrative diagram of READ waveforms for understanding the operation of the non-volatile memory cell of FIG. 4.

Referring now to FIGS. 4 and 5, an embodiment of a non-volatile memory register (e.g., NV cell 311) is shown. NV cell 311 comprises (i) a non-volatile transistor 400, (ii) a programming circuit 410 and (iii) an output reading circuit 450. Programming circuit 410 is used to program non-volatile transistor 400 and includes PMOS transistors 420, 425 and NMOS transistors 430, 435, 440, 445 in this embodiment. Transistors 420, 425, 430 and 435 constitute a cross-coupled level shifter. Output reading circuit 450 includes a PMOS transistor 455, an NMOS transistor 460 and an inverter 465.

As shown in FIG. 5, waveforms illustrate how NV cell 311 of FIG. 4 functions during a read operation where PMOS transistor 455 acts as a current source with the bias current input from READIB 500. A control gate ($V_g$) 401 and source ($V_s$) 402 of non-volatile transistor 400 are at ground (GND). If non-volatile transistor 400 has been programmed with a negative threshold, it will be turned on. Thus, when READB input 510 goes low (turning off NMOS transistor 460), it will keep the input ($V_d$) to inverter 465 low and DATAOUT 520 high. If non-volatile transistor 400 has been programmed to a positive threshold, it will be turned off so that when the READB input 510 goes low, the input ($V_d$) to inverter 465 will rise due to the current from PMOS transistor 455 and DATAOUT 520 will go low. During the read operation, STOREB 530 is high and VPP 540 is at GND, assuring that control gate ($V_g$) 401 of non-volatile transistor 400 is at GND. The rest of the circuitry in FIG. 4 is used for programming.

Figure 6:
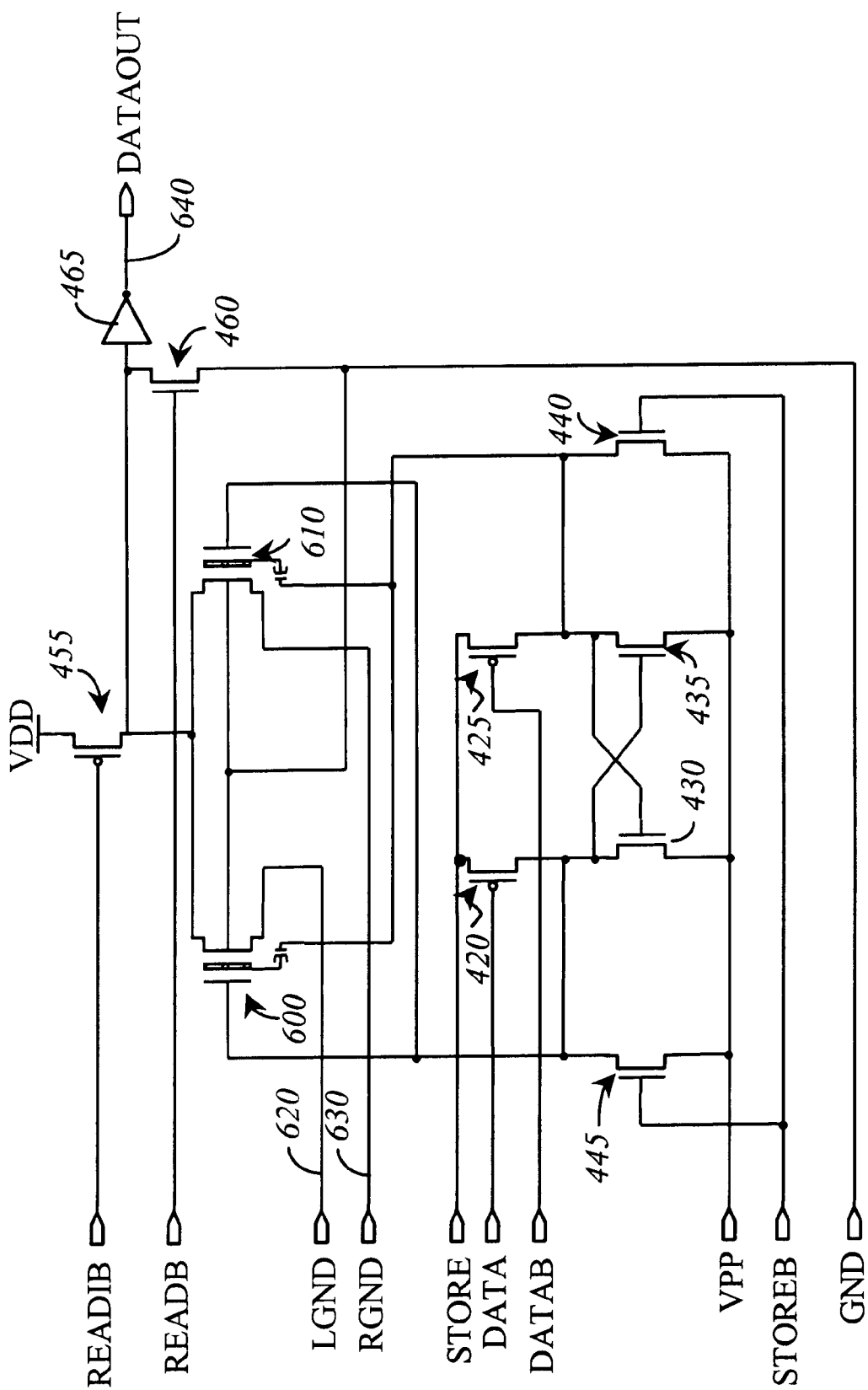
FIG. 6 is an illustrative block diagram of an embodiment of a non-volatile memory cell with redundancy and programming and reading circuitry employed in the single stage of FIG. 3.

Another non-volatile transistor can be added to NV cell 311 to provide redundancy and thereby improve reliability. This non-volatile memory cell with redundancy is shown in FIG. 6. Two non-volatile transistors 600 and 610 are coupled in parallel except for the sources, which are brought out separately as test lines LGND 620 and RGND 630. The rest of the circuitry is the same as NV cell 311 of FIG. 4. Bringing the sources out separately allows for an independent test of non-volatile transistors 600 and 610.

Figure 7:
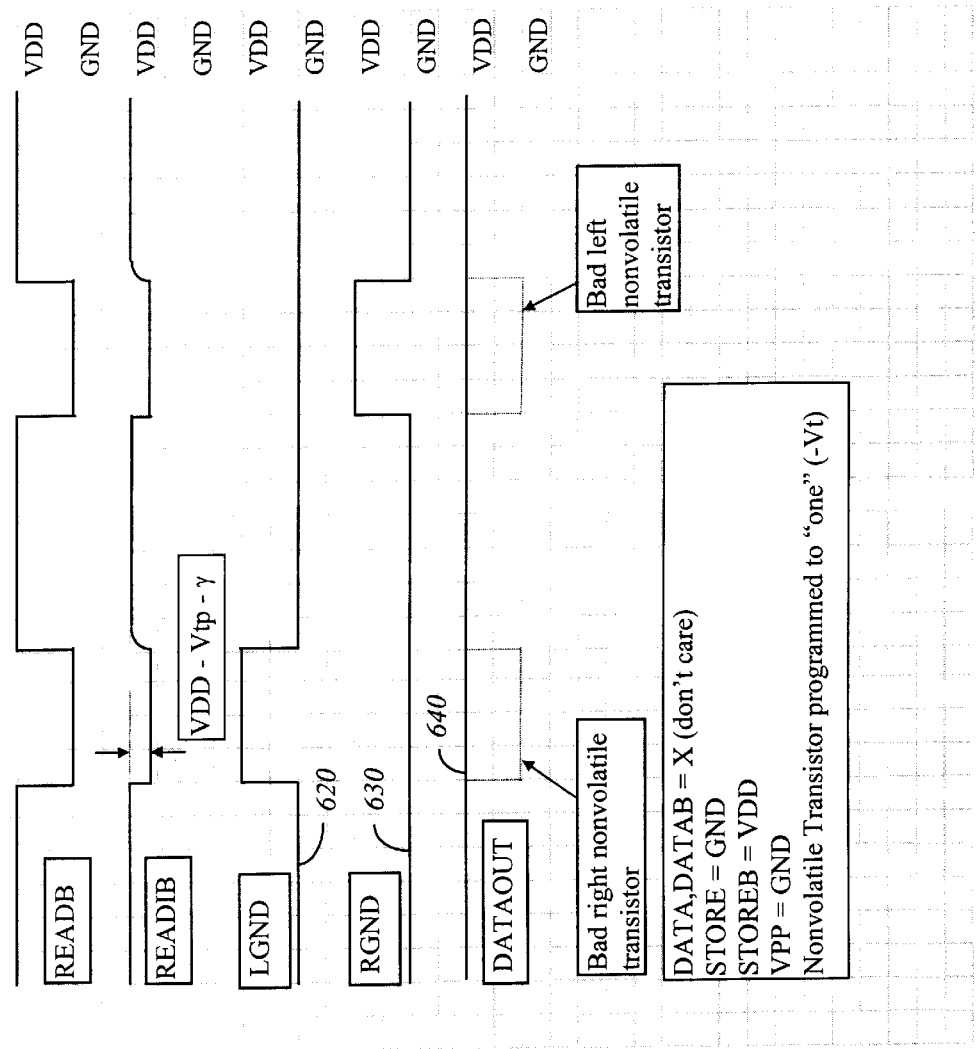
FIG. 7 is an illustrative diagram of an embodiment of a non-volatile memory transistor test waveform to test the non-volatile transistors associated with the non-volatile memory cell of FIG. 6.

Referring to FIG. 7, an embodiment of non-volatile memory transistor test waveforms is shown in order to better illustrate how non-volatile memory transistors 600 and 610 of FIG. 6 may be tested. If one of non-volatile transistors 600 or 610 is shorted, it will be caught in normal read testing. However, an open (or non-programmable) non-volatile transistor cannot be detected during the normal read (due to the redundancy). The non-volatile memory transistor test waveforms of FIG. 7 illustrate how to test for this condition. First, the non-volatile memory cell with redundancy is programmed with negative thresholds in non-volatile transistors 600 and 610. Normal read commands are applied to all inputs except LGND 620 and RGND 630. When LGND 620 is pulsed high and RGND remains low, it tests non-volatile transistor 610. When RGND 630 is pulsed high and LGND remains low, it tests non-volatile transistor 600. If DATAOUT 640 goes low when one of non-volatile transistor 600 or 610 is being tested, non-volatile transistor 600 or 610 is open or not programmed adequately. Passing these tests assures that both non-volatile transistors 600 and 610 are operational and the benefits of redundancy are available. The ability to fully test the redundancy of the non-volatile memory cell is a feature not practiced in the prior art.

Figure 8:
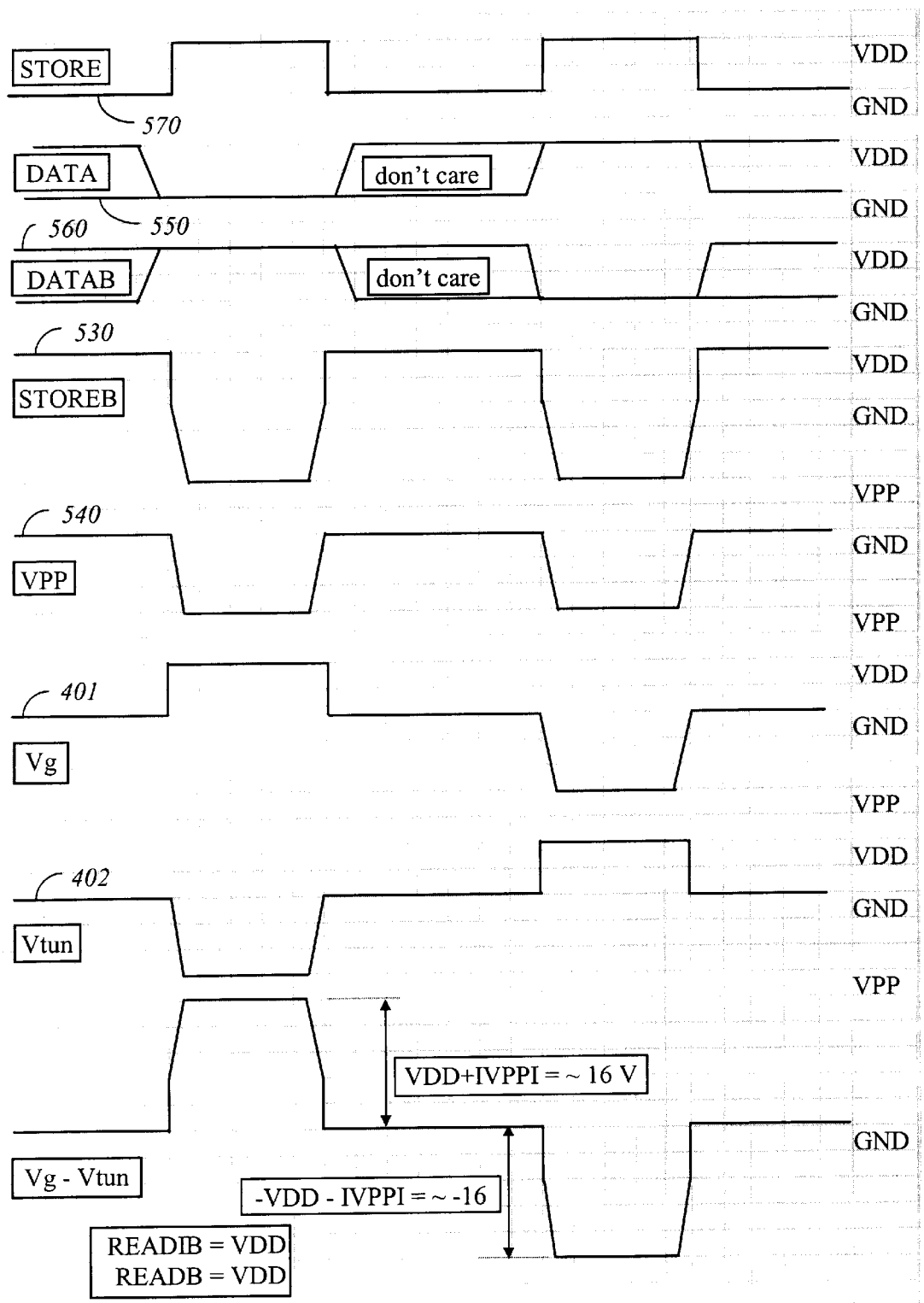
FIG. 8 is an illustrative diagram of an embodiment of programming waveforms necessary to program the non-volatile memory cell of FIG. 4.

Referring now to FIGS. 4 and 8, to program a memory cell, the inputs READIB 500 and READB 510 are held high at VDD. Data is input via the DATA and DATAB inputs 550 and 560. When STORE input 570 is taken high, data is transferred via PMOS transistors 420 and 425 to cross-coupled NMOS transistors 430 and 435, where it is latched. The input STOREB 530 is low, so that NMOS transistors 440 and 445 are off. One side of this latch is connected to a diffusion under the tunnel oxide ($V_{tun}$) 403 of non-volatile transistor 400, and the other side of the latch is connected to control gate ($V_g$) 401 of non-volatile transistor 400. At this point, the programming voltage is only at the VDD level (not sufficient to program non-volatile transistor 400). The input VPP 540 begins the programming sequence at ground and then becomes negative to attain a sufficient voltage to program non-volatile transistor 400. This results in the difference of the negative voltage (VPP) 540 and the positive voltage (VDD) being applied across the tunnel oxide of non-volatile transistor 400, programming it to either an "on" state or an "off" state depending on the state of input DATA 550. Note that if non-volatile transistor 400 is already in the same state to be programmed, there is no state change. This is an advantage over more typical memory cells, which are first erased and then rewritten with the same state information.

Figure 9:
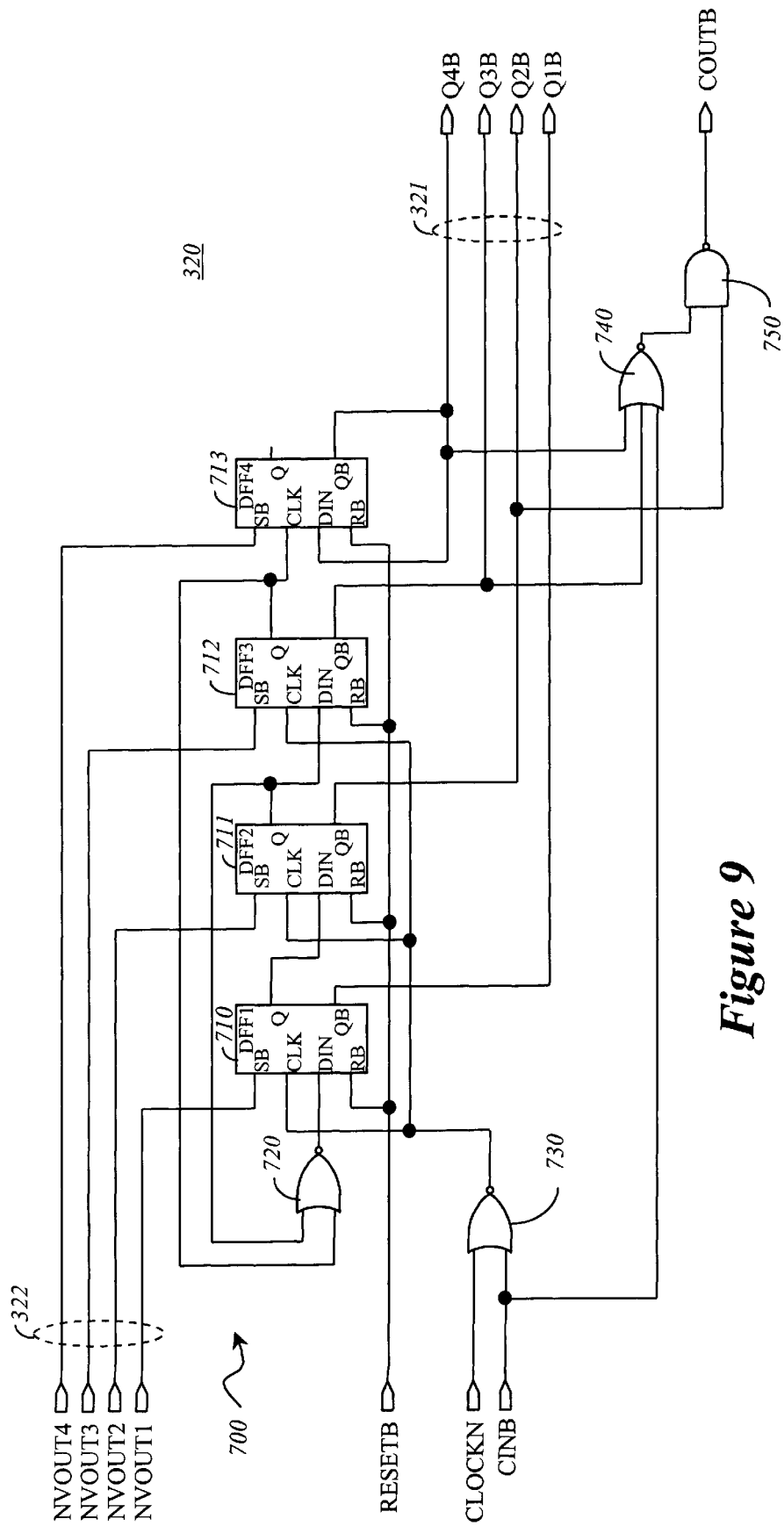
FIG. 9 is an illustrative block diagram of an embodiment of a pseudo gray decade counter of FIG. 3 and associated input/output circuitry of FIG. 3.

Referring to FIG. 9, pseudo-gray decade counter 320 of FIG. 3 comprises a counter 700 and a small number of logic gates. Counter 700 includes a plurality of D-type flip-flops (DFF1–DFF4) 710–713 and NOR GATE 720. The output of DFF1 710 depends on the state of DFF2 711 and DFF3 712. DFF2 711 and DFF3 712 are configured as a shift register. DFF4 713 toggles with the data from the output of preceding DFF3 712. Together, this circuitry generates the pseudo-gray code described earlier.

The clock for DFF1 710, DFF2 711 and DFF3 712 is provided from NOR gate 730 having inputs CLOCKN and CINB. CINB is an input carry signal from a preceding stage (or tied low) and CLOCKN is the input clock signal. NOR gate 740 and NAND gate 750 receive an input CINB from a preceding stage (or tied low) and outputs from counter 700 (Q4B, Q3B, Q2B) generate the carry output COUTB. This implementation is considerably less complex than a standard BCD counter, saving area (costs) when implemented in an integrated circuit.

Figure 10:
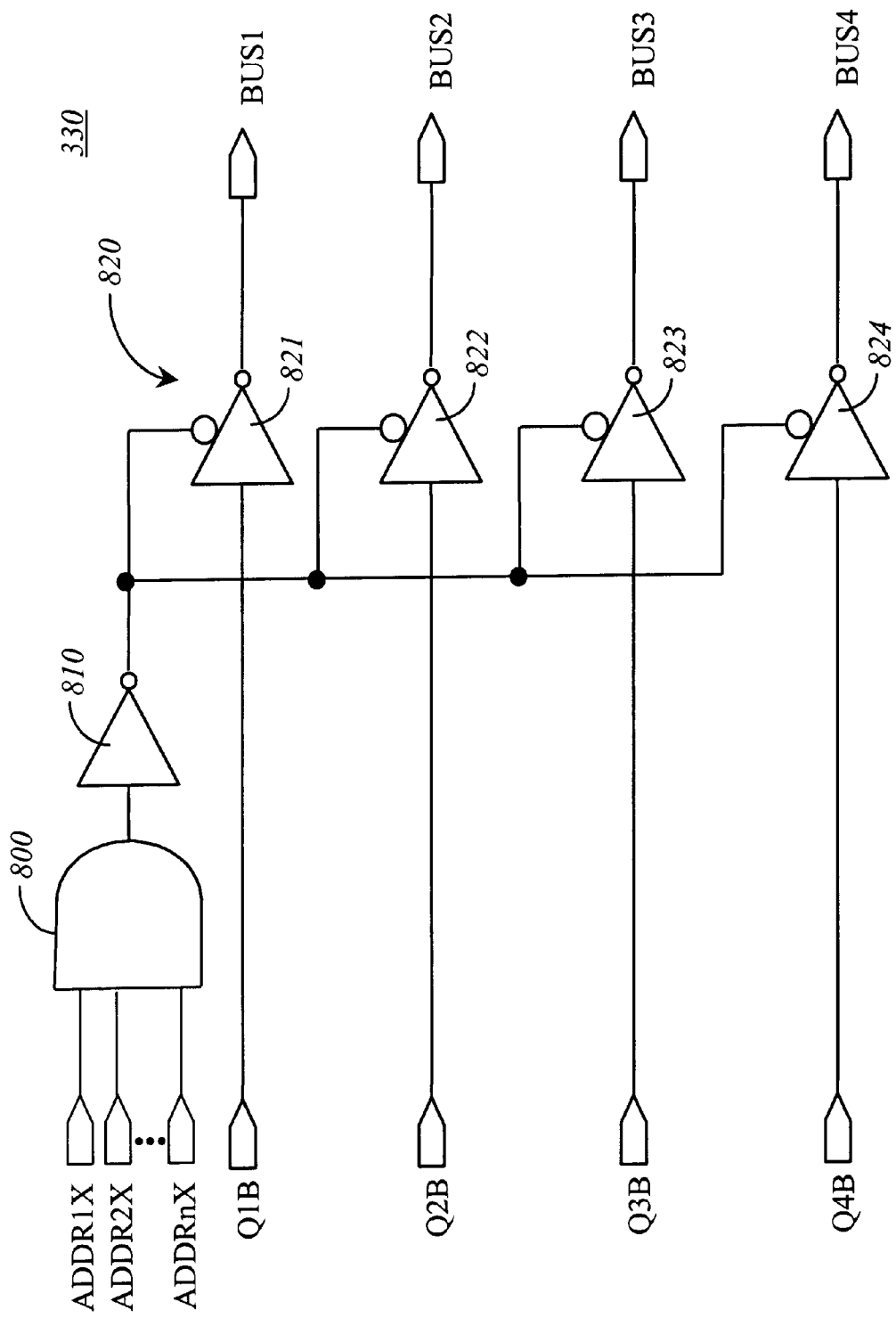
FIG. 10 is an illustrative block diagram of an embodiment of circuitry of the bus interface of FIG. 3.

Referring now to FIG. 10, an embodiment of bus interface 330 for a stage of pseudo-gray counter 200 of FIGS. 2 and 3 is shown. In this embodiment, bus interface 330 comprises an AND gate 800, an inverter 810 and a plurality of tri-state inverters 820 (e.g., tri-state inverters 821–824). The function of bus interface 330 is simply to transfer data from an output of pseudo-gray decade counter 320 to output bus 235 of FIG. 3.

Figure 11:
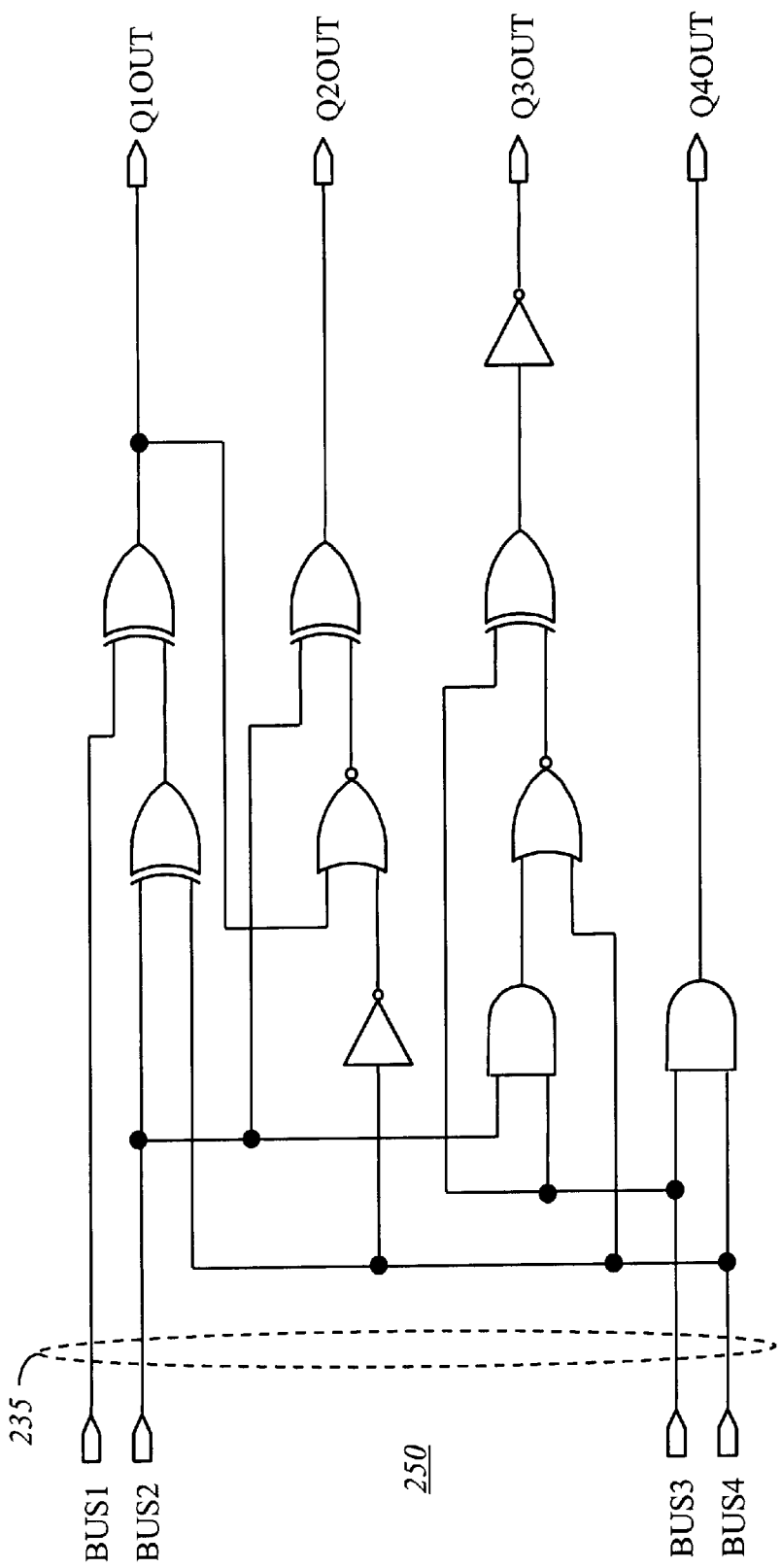
FIG. 11 is an illustrative block diagram of an embodiment of logic forming the PGBCD converter of FIG. 2.

Finally, in FIG. 11, an embodiment of PGBCD converter 250 of FIG. 2 is shown. Herein, the data on output bus (e.g., BUS1–4) 235 is converted from the pseudo-gray code to standard binary code typical of BCD counters. Combinatorial logic (e.g., a collection of AND gates, NOR gates, XOR gates, and/or inverters, etc.) is used for this conversion. In this embodiment, the output (QxOUT, x=1, 2, 3, or 4) of PGBCD converter 250 is the following:

Q1OUT=BUS1 XOR (BUS2 XOR BUS4);
Q2OUT=[NOT(BUS4) NOR QOUT1] XOR BUS2;
Q3OUT=NOT[((BUS2 AND BUS3) NOR BUS4) XOR BUS3]; and
Q4OUT=BUS3 AND BUS4.

The present invention described herein may be designed in many different architectures and using many different components. While the present invention has been described in terms of various embodiments, other embodiments may come to mind to those skilled in the art without departing from the spirit and scope of the present invention. For example, the invention may be utilized in other types of counters besides BCD counters. The invention should, therefore, be measured in terms of the claims that follow.

What is claimed is:

1. A non-volatile memory cell comprising:
   a programmable transistor to store a logic state during power off, the programmable transistor including a control gate and a diffusion under a tunnel oxide;
   a programmable circuit coupled to the control gate of the programmable transistor and the diffusion, the programming circuit to program the programmable transistor; and an output reading circuit coupled to a source and a drain of the programmable transistor.

2. The non-volatile memory cell of claim 1, wherein the programmable transistor is a single non-volatile transistor.

3. The non-volatile memory cell of claim 1, wherein the programming circuit includes a cross-coupled level shifter coupled to the control gate and the diffusion.

4. The non-volatile memory cell of claim 3, wherein the cross-coupled level shifter applies one polarity of a most positive and a most negative potentials across the control gate and the diffusion.

5. The non-volatile memory cell of claim 2, wherein the output reading circuit including
   a PMOS transistor coupled to the drain of the non-volatile transistor;
   a NMOS transistor coupled to the source of the non-volatile transistor; and
   an inverter coupled to a drain of the PMOS transistor, the drain of the non-volatile transistor and a drain of the NMOS transistor.

6. The non-volatile memory cell of claim 1, wherein the programmable transistor includes a pair of non-volatile transistors having gates and drains in parallel and sources lacking parallelism.

7. The non-volatile memory cell of claim 6, wherein a test line is coupled to each source of the non-volatile transistors.

8. A memory cell comprising:
   a transistor including a control gate and a diffusion under a tunnel oxide;
   a programming circuit coupled to the control gate of the programmable transistor and the diffusion; and
   an output reading circuit coupled to a source and a drain of the programmable transistor.

9. The memory cell of claim 8, wherein the transistor is programmable.

10. The memory cell of claim 9, wherein the programmable transistor is a single non-volatile transistor.

11. The memory cell of claim 8, wherein the programming circuit includes a cross-coupled level shifter coupled to the control gate and the diffusion.

12. The memory cell of claim 11, wherein the cross-coupled level shifter applies one polarity of a most positive and a most negative potentials across the control gate and the diffusion.

13. The memory cell of claim 8, wherein the output reading circuit including
    a PMOS transistor coupled to the drain of the transistor;
    a NMOS transistor coupled to the source of the transistor; and
    an inverter coupled to a drain of the PMOS transistor, the drain of the transistor and a drain of the NMOS transistor.

14. The memory cell of claim 9, wherein the programmable transistor includes a pair of non-volatile transistors having gates and drains in parallel and sources lacking parallelism.

15. The memory cell of claim 14, wherein a test line is coupled to each source of the non-volatile transistor.

16. A non-volatile memory cell comprising:
    a programmable transistor to store a logic state during power off the programmable transistor including a control gate and a diffusion under a tunnel oxide; and
    a programmable circuit coupled to the control gate of the programmable transistor, and the diffusion, the programmable circuit to program the programmable transistor.

17. The non-volatile memory cell of claim 16, further comprising:
    an output reading circuit coupled to a source and a drain of the programmable transistor.

18. The non-volatile memory cell of claim 16, wherein the programmable transistor is a single non-volatile transistor.

19. The non-volatile memory cell of claim 16, wherein the programmable circuit includes a cross-coupled level shifter coupled to the control gate and the diffusion, the cross-coupled level shifter applies on polarity of a most positive and a most negative potentials across the control gate and the diffusion.

20. The non-volatile memory cell of claim 17, wherein the output reading circuit including
    a PMOS transistor coupled to the drain of the non-volatile transistor;
    a NMOS transistor coupled to the source of the non-volatile transistor; and
    an inverter coupled to a drain of the PMOS transistor, the drain of the non-volatile transistor and a drain of the NMOS transistor.

21. The non-volatile memory cell of claim 16, wherein the programmable transistor includes a pair of non-volatile transistors having gates and drains in parallel and sources lacking parallelism.

22. The non-volatile memory cell of claim 21, wherein a test line is coupled to each source of the non-volatile transistors.

* * * * *